(12) United States Patent  (10) Patent No.: US 8,575,759 B2
Nakano  (45) Date of Patent: Nov. 5, 2013

(54) SEMICONDUCTOR DEVICE AND ELECTRONIC APPARATUS INCLUDING THE SAME

(75) Inventor: Takahiro Nakano, Kyoto (JP)

(73) Assignee: Panasonic Corporation, Osaka (JP)

( * ) Notice: Subject to any disclaimer, the term of this patent is extended or adjusted under 35 U.S.C. 154(b) by 73 days.

(21) Appl. No.: 13/285,132

(22) Filed: Oct. 31, 2011

(65) Prior Publication Data

US 2012/0043665 A1 Feb. 23, 2012

Related U.S. Application Data

(63) Continuation of application No. PCT/JP2010/000855, filed on Feb. 12, 2010.

(30) Foreign Application Priority Data

May 14, 2009 (JP) .................. 2009-118075

(51) Int. Cl.
*H01L 23/48* (2006.01)

(52) U.S. Cl.
USPC .......... 257/774; 257/773; 257/775; 257/778; 257/E23.011; 438/629; 438/637

(58) Field of Classification Search
USPC .................. 257/774, 773, 775, 778, E23.011; 438/629.637

See application file for complete search history.

(56) References Cited

U.S. PATENT DOCUMENTS 7,723,213 B2 * 5/2010 Ichikawa ................. 438/464

* cited by examiner

*Primary Examiner* — Thinh T Nguyen
(74) *Attorney, Agent, or Firm* — Panasonic Patent Center (57) ABSTRACT

A semiconductor device according to the present invention is a semiconductor device that includes: a semiconductor substrate having metal wiring formed on a bottom surface of the semiconductor substrate; and a plurality of wiring layers formed above the semiconductor substrate. The wiring layers include a first wiring layer and a second wiring layer that is formed above the first wiring layer. The semiconductor device further includes: a first through electrode which electrically connects the first wiring layer and the metal wiring; a second through electrode which electrically connects the second wiring layer and the metal wiring; and at least one layer difference adjustment film formed between the semiconductor substrate and the wiring layers. The at least one layer difference adjustment film includes a layer difference adjustment film formed on a region excluding a region corresponding to the second through electrode.

15 Claims, 5 Drawing Sheets

SEMICONDUCTOR DEVICE AND ELECTRONIC APPARATUS INCLUDING THE SAME

CROSS REFERENCE TO RELATED APPLICATION

This is a continuation application of PCT application No. PCT/JP2010/000855 filed on Feb. 12, 2010, designating the United States of America.

BACKGROUND OF THE INVENTION (1) Field of the Invention

The present invention relates to semiconductor devices.

(2) Description of the Related Art

In order to reduce the size, thickness, and weight of electronic apparatuses and achieve packaging thereof in a high density, many semiconductor devices manufactured using techniques of wafer-level chip size packaging (CSP) which enables fabrication processing at wafer level, have been used in recent electronic apparatus.

An example of the application of such semiconductor device includes solid-state imaging devices which are typical of optical devices. The solid-state imaging devices are used as photosensors in digital imaging apparatuses, such as digital still cameras, cameras built in mobile phones, and digital camcorders. In order to achieve such reduction of the size, thickness, and weight of imaging apparatuses and packaging thereof in a high density, techniques of the wafer-level CSP have been used for manufacturing the solid-state imaging devices instead of techniques of ceramic-type or plastic-type packaging. The ceramic-type packaging and the plastic-type packaging ensure electrical connection between inside and outside the apparatuses by die bonding and wire bonding. On the other hand, in the techniques for the wafer-level CSP, the electrical connection between inside and outside the apparatuses are ensured by forming through electrodes and rewiring in fabrication processing on wafers before dicing (for example, see patent reference 1: Japanese Unexamined Patent Application Publication Number 2004-207461 and patent reference 2: Japanese Unexamined Patent Application Publication Number 2007-123909).

Figure 5:
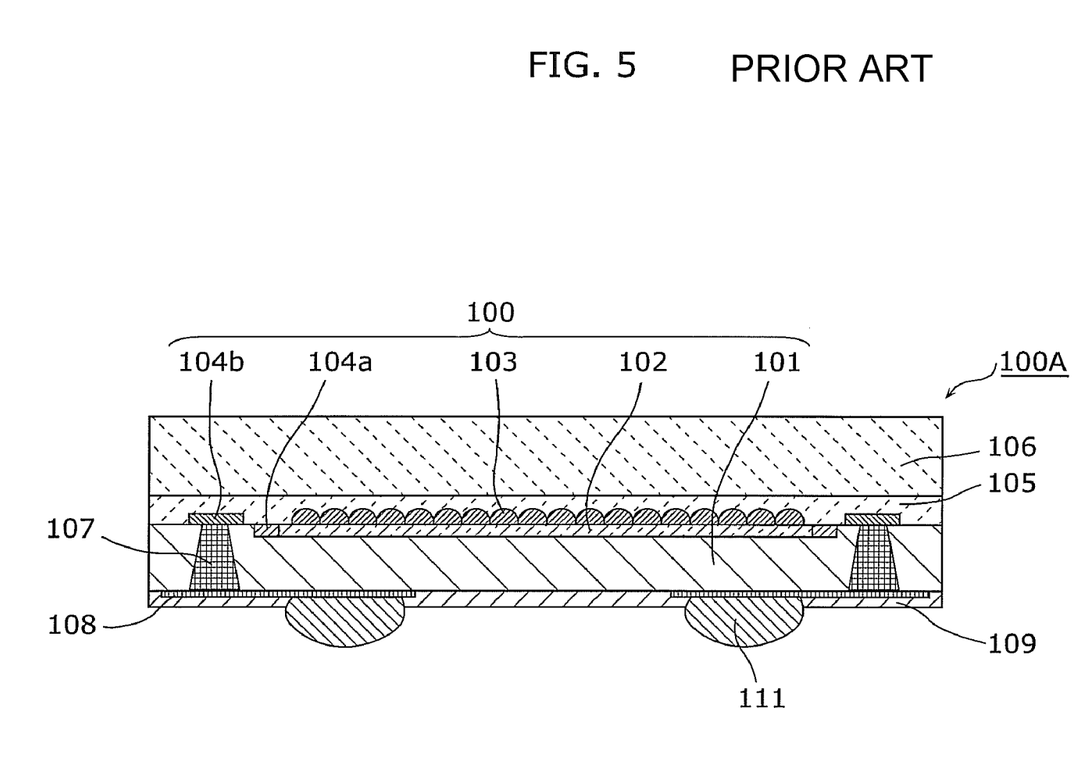
FIG. 5 is a cross-sectional view showing a configuration of a conventional solid-state imaging device.

FIG. 5 is a cross-sectional view showing a configuration of a solid-state imaging device which has a conventional wafer-level CSP structure.

As shown in FIG. 5, a conventional solid-state imaging device 100A includes a solid-state imaging element 100 including an imaging area 102, a peripheral circuit area 104a, and a plurality of electrode portions 104b. The imaging area 102 is located on a semiconductor substrate 101 and has a plurality of microlenses 103 on a main surface, which is a light-receiving surface, of the semiconductor substrate 101, and generates a light-reception signal according to received light. The peripheral circuit area 104a is formed in a surrounding area of the imaging area 102 on the main surface, and processes light-reception signals generated in the imaging area 102. The electrode portions 104b are electrically connected to the peripheral circuit area 104a and take out light-reception signals processed by a peripheral circuit area 104a.

In addition, a transparent substrate 106 made of, for example, optical glass, is formed above the main surface of the semiconductor substrate 101 with a bonding member 105 made of resin interposed therebetween. In addition, in the semiconductor substrate 101, through electrodes 107 are formed which penetrate through the semiconductor substrate 101 in the thickness direction of the semiconductor substrate 101.

On a back surface, which is opposite to the main surface of the semiconductor substrate 101, metal wiring 108 is formed. The metal wiring 108 is electrically connected to the electrode portions 104b of the peripheral circuit area 104a via the through electrodes 107. Further, on the back surface of the semiconductor substrate 101, an insulating resin layer 109 which covers part of the metal wiring 108 is formed. The rest of the metal wiring 108 is exposed in through-holes in the insulating resin layer 109. In each of the through-holes, an external electrode 111 made of, for example, a solder material is formed.

Note that the solid-state imaging element 100 is electrically insulated from the through electrodes 107 and the metal wiring 108 by an insulating layer not shown in FIG. 5.

As described above, in the conventional solid-state imaging device 100A, the electrode portions 104b are electrically connected to the metal wiring 108 via the through electrodes 107, and further to the external electrodes 111 via the metal wiring 108, thus allowing light-reception signals to be taken out from the external electrode 111.

The conventional solid-state imaging device 100A is manufactured through a process exemplified below.

(Step 1) A plurality of solid-state imaging elements 100 having the above-described structure are formed on a wafer using a known method. The transparent base material that has the same shape as the wafer is attached to the wafer having the solid-state imaging elements 100 formed thereon, via aggregate of the bonding member 105 made of a resin layer. Note that transparent base material is aggregate of the transparent substrate 106 which is made of, for example, optical glass.

(Step 2) Through-holes are formed in the wafer by dry etching or wet etching from the back surface of the wafer. The through-holes penetrate through the semiconductor substrate 101 and reach the electrode portions 104b. Then, the through-holes are filled with a conductive material to form the through electrodes 107 connecting to the electrode portions 104b which allows light-reception signals to be taken out.

(Step 3) The metal wiring 108 is formed on the back surface of the solid-state imaging elements 100 by electroplating in a manner such that the metal wiring 108 electrically connects to the through electrodes 107.

(Step 4) The insulating resin layer 109 is formed on the back surface of the solid-state imaging elements 100 so as to cover the metal wiring 108. Typically, the insulating resin layer 109 is made of photosensitive resin and aggregate of the insulating resin layer 109 is formed by spin-coating or applying a dry film.

(Step 5) The insulating resin layer 109 is selectively removed by a photolithographic technique (exposure and developing) to form the openings in which part of the metal wiring 108 is exposed.

(Step 6) The external electrodes 111 are formed in the respective openings by a solder ball mounting method using flux or a solder paste printing method in a manner such that the external electrodes 111 electrically connects to the metal wiring 108. The external electrodes 111 are made of, for example, a solder material.

(Step 7) Finally, using a cutting tool such as a dicing saw, the wafer on which a plurality of solid-state imaging elements 100 are formed, the aggregate of bonding member 105, the transparent base material, and the aggregate of insulating resin layer 109 are cut together into a plurality of solid-state imaging devices, each of which is the solid-state imaging device 100A shown in FIG. 5.

SUMMARY OF THE INVENTION

However, according to the above-described conventional solid-state imaging device 100A, when the electrode portion 104b that is connected to the peripheral circuit area 104a includes electrodes formed in different layers, a through electrode is formed for each of the electrodes formed in a different layer. In other words, when forming through electrodes, processing time to reach the electrode in each layer is different depending on a layer in which the electrode is formed, depending on a step between electrodes which are formed in different layers and the number of layers or thickness of insulating films formed immediately below each electrode. This causes the following problems:

(i) Variation in a connection diameter (area) between the through electrode and the electrode portion is large;

(ii) A semiconductor substrate and an insulating film are hollowed. The hollows are generated in a vicinity of a connection portion between the through electrode and the electrode portion, and have reverse taper shape as compared to an taper angle of an entire through electrode; and (iii) Through-hole making process is excessively performed for a lowermost layer electrode portion (an electrode portion which the through electrode is first in contact with).

The above described (i) and (ii) lead to occurrence of electrical conduction disorder or reduced reliability of the through electrode, and (iii) leads to breakage or penetration of the electrode portion caused by excessive etching of the electrode portion and a leakage failure or opening failure caused by a product generated by a reaction with the electrode portion.

As a countermeasure, all the electrodes connected to the through electrodes can be aligned in the same layer. However, this reduces flexibility in electrodes arrangement and wiring formation and increases the number of manufacturing steps. Alternatively, a film which prevents excessive processing for the solid-state imaging device 100A in through-hole making (etch stop film) can be formed immediately below the electrodes. However, this cannot solve the problem (ii) described above. Thus, neither of the above is sufficient as a countermeasure.

In view of the above, the present invention has an objective to prevent the occurrence of the above described conventional problems by performing stable formation of through electrodes for electrode portions and wiring layers in different layers. In other words, the present invention has an objective to provide a semiconductor device in which through electrodes for electrode portions and wiring layers in different layers are stably formed. Furthermore, the present invention also has an objective to provide electronic apparatuses which include such semiconductor devices.

To achieve the above objective, a semiconductor device according to the present invention includes: a semiconductor substrate having metal wiring formed on a bottom surface of the semiconductor substrate; and a plurality of wiring layers formed above the semiconductor substrate. The wiring layers include a first wiring layer and a second wiring layer that is formed above the first wiring layer. The semiconductor device further includes: a first through electrode which electrically connects the first wiring layer and the metal wiring; a second through electrode which electrically connects the second wiring layer and the metal wiring; and at least one adjustment layer formed between the semiconductor substrate and the wiring layers. The at least one adjustment layer includes a first adjustment layer formed on a region excluding a region corresponding to the second through electrode.

With this, it is possible to reduce difference in thickness between the first through electrode and the second through electrode connected to mutually different wiring layers as compared to the case where the first adjustment layer is not included. As a result, in an etching process for forming the first through electrode and the second through electrode, it is possible to reduce difference in required time between formation of through-hole that reaches the first wiring layer and formation of through-hole that reaches the second wiring layer.

Thus, there are less variation in a connection diameter between the first wiring layer and the first through electrode and a connection diameter between the second wiring layer and the second through electrode. Furthermore, an other layer in the vicinity of connection between each wiring layer and each through electrode is less likely to be hollowed and cave in. Furthermore, it is possible to prevent breakage and penetration of the first wiring layer caused by excessive etching.

In other words, both the first through electrode for the first wiring layer and the second through electrode for the second wiring layer, which is formed above the first wiring layer, can be formed stably.

Furthermore, the semiconductor device may further include a plurality of insulating layers, wherein the insulating layers correspond one-to-one to the wiring layers, each of the insulating layers being formed immediately below a corresponding one of the wiring layers, and the at least one adjustment layer is formed below the insulating layers.

With this, the at least one adjustment layer is insulated from each of the wiring layers by the corresponding one of the insulating layers. Thus the at least one adjustment layer may include a conductive material.

Furthermore, the at least one adjustment layer may be made of a same material as a material for the insulating layers.

With this, in the etching process for forming the first through electrode and the second through electrode, the semiconductor device according to the present invention requires the same amount of time per unit thickness of the first adjustment layer and each of the insulating layers. As a result, when the first adjustment layer and each of the insulating layers have the same thickness, it is possible to form the first through electrode and the second through electrode in substantially the same processing time in a manufacturing process of the semiconductor device. Thus, the first through electrode and the second through electrode can be formed stably without individually controlling the processing time to form the first through electrode and the second through electrode.

Furthermore, the number of layers of the insulating layers may be the same as the number of layers of the wiring layers.

Furthermore, the number of layers of the at least one adjustment layer may be one less than the number of layers of the wiring layers.

With this, with any number of wiring layers, the first through electrode and the second through electrode can be formed stably.

Furthermore, the at least one adjustment layer need not be in contact with the second through electrode.

With this, an entire top surface of the second through electrode is in contact with the second wiring layer. Thus, there is less chance that the second through electrode and the second wiring layer become non-conductive.

Furthermore, when the semiconductor device is manufactured such that the diameters of the first through electrode and the second through electrode on the bottom surface of the semiconductor substrate are substantially the same, a connection area between the first through electrode and the first wiring layer and a connection area between the second through electrode and the second wiring layer are also substantially the same. Thus, it is easy to reduce a variation in connection area.

Furthermore, the first through electrode and the second through electrode may penetrate through a same number of layers.

Furthermore, a distance from a top surface of the semiconductor substrate to a top surface of the first through electrode may be substantially equal to a distance from a top surface of the semiconductor substrate to a top surface of the second through electrode.

With this, a level difference between the first wiring layer and the second wiring layer is substantially zero. This further stabilizes the formation of the first through electrode and the second through electrode.

Furthermore, the wiring layers may further include a third wiring layer formed between the first wiring layer and the second wiring layer. The semiconductor device may further include a third through electrode which electrically connects the third wiring layer and the metal wiring. The at least one adjustment layer may further include a second adjustment layer formed on a region excluding a region corresponding to the second through electrode and a region corresponding to the third through electrode.

With this, even when there are three wiring layers, each of the through electrodes formed for a corresponding one of the wiring layers can be stably formed.

Furthermore, the at least one adjustment layer may be made of silicon oxide or silicon nitride.

Furthermore, the semiconductor device may further include: a first protective film that is formed on the bottom surface of the semiconductor substrate so as to cover the metal wiring, wherein the first protective film includes a through-hole formed to penetrate through the first protective film, from a top surface to a bottom surface, on a region overlapping the metal wiring.

With this, deterioration of the metal wiring due to an exposure to an external environment can be prevented.

Furthermore, the semiconductor device may further include an external electrode that is formed inside the through-hole and on the first protective film so as to plug the through-hole, wherein the external electrode is electrically connected to the first wiring layer through the metal wiring and the first through electrode or to the second wiring layer through the metal wiring and the second through electrode.

With this, the semiconductor device can be mounted on another substrate using a flip-chip mounting method.

Furthermore, the semiconductor device may further include a second protective film that is formed above the semiconductor substrate so as to cover a topmost wiring layer among the wiring layers.

With this, deterioration of the topmost wiring layer due to an exposure to an external environment is prevented.

Furthermore, the semiconductor device may further include a transparent substrate that is formed on the second protective film with a bonding layer interposed between the second protective film and the transparent substrate.

With this, each layers and the semiconductor substrate located below an optical substrate can take in external light. Thus, the semiconductor device can be used as an optical device. Furthermore, resistance to an external environment is further enhanced.

Furthermore, an electronic apparatus according to the present invention includes the above-described semiconductor device.

As described above, the semiconductor device according to the present invention enables to stably form through electrodes for electrode portions and wiring layers located in different layers.

FURTHER INFORMATION ABOUT TECHNICAL BACKGROUND TO THIS APPLICATION

The disclosure of Japanese Patent Application No. 2009-118075 filed on May 14, 2009 including specification, drawings and claims is incorporated herein by reference in its entirety.

The disclosure of PCT application No. PCT/JP2010/000855 filed on Feb. 12, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

(Embodiment 1)

A semiconductor device according to Embodiment 1 includes: a semiconductor substrate having metal wiring formed on a bottom surface of the semiconductor substrate; and a plurality of wiring layers formed above the semiconductor substrate. The wiring layers include a first wiring layer and a second wiring layer that is formed above the first wiring layer. The semiconductor device further includes: a first through electrode which electrically connects the first wiring layer and the metal wiring; a second through electrode which electrically connects the second wiring layer and the metal wiring; and at least one adjustment layer formed between the semiconductor substrate and the wiring layers. The at least one adjustment layer includes a first adjustment layer formed on a region excluding a region corresponding to the second through electrode.

Figure 1:
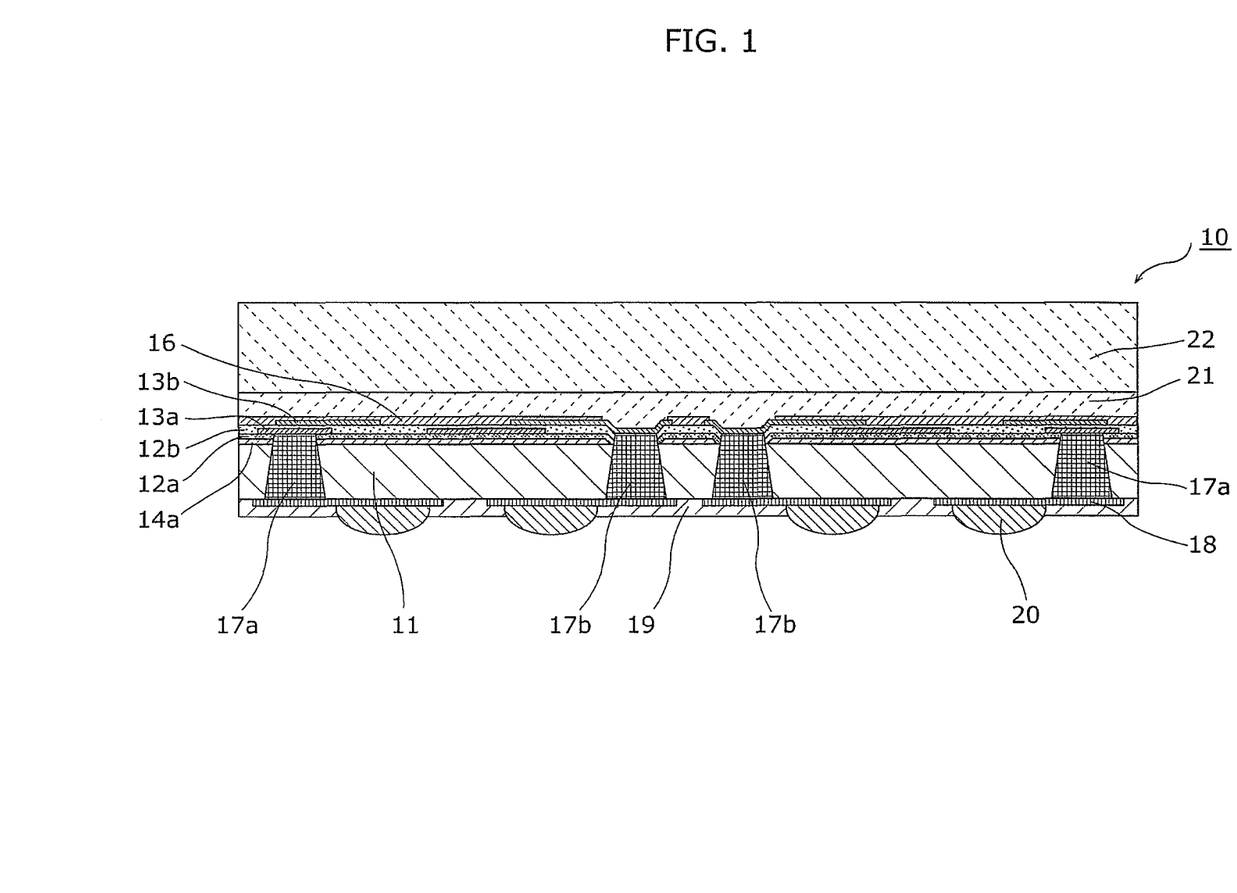
FIG. 1 is a cross-sectional view showing a configuration of a semiconductor device according to Embodiment 1 of the present invention.
Figure 2:
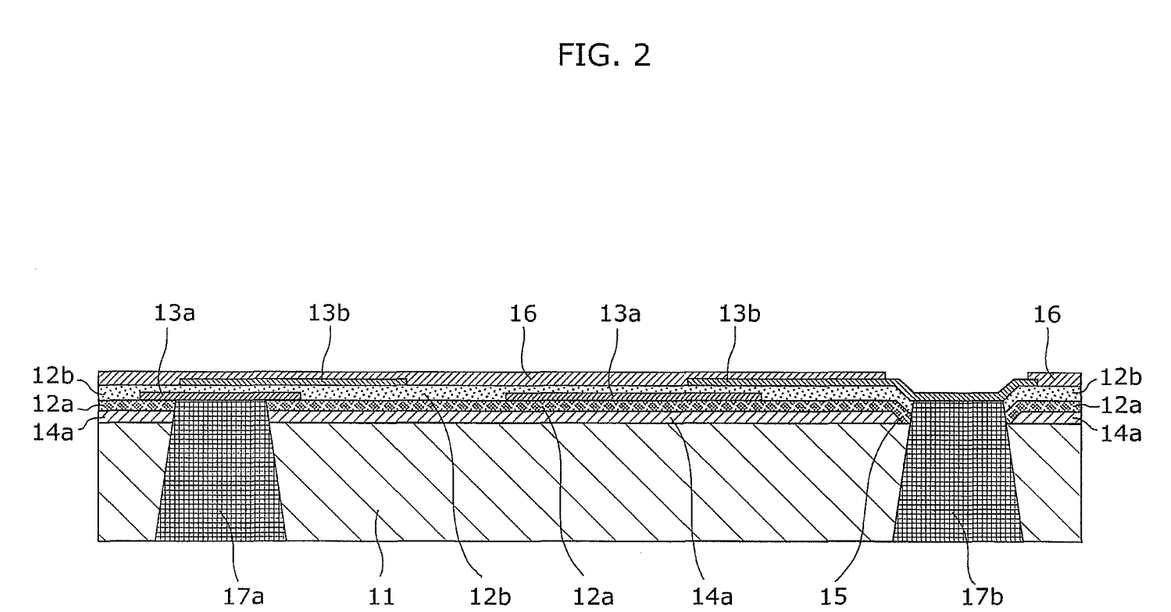
FIG. 2 is an enlarged cross-sectional view showing a configuration of main parts of the semiconductor device.

Following describes a configuration of the semiconductor device according to Embodiment 1 of the present invention with reference to FIG. 1 and FIG. 2. FIG. 1 is a cross-sectional view showing a configuration of the semiconductor device according to this embodiment. FIG. 2 is a cross-sectional view showing on an enlarged scale a configuration of main parts of the semiconductor device according to this embodiment.

As shown in FIG. 1 and FIG. 2, a semiconductor device 10 according to this embodiment includes: a semiconductor substrate 11, a first insulating film 12a, a second insulating film 12b, a first wiring layer 13a, a second wiring layer 13b, a layer difference adjustment film 14a, a circuit protective film 16, a first through electrode 17a, a second through electrode 17b, an external protective film 19, an external electrode 20, a bonding layer 21, and a transparent substrate 22.

The semiconductor substrate 11 is, for example, a silicon substrate having a transistor and a photodiode formed thereon. On a back surface (lower surface in the figure) of the semiconductor substrate 11, metal wiring 18 is formed.

The metal wiring 18 is formed by plating the back surface of the semiconductor substrate 11 with, for example, Cu or a metal material mainly made of Cu. Preferable thicknesses of the metal wiring 18 are within a range of 5 μm to 20 μm.

The first insulating film 12a and the second insulating film 12b are films formed above the semiconductor substrate 11, and mainly made of an inorganic material such as SiO2 or SiN and have insulating properties. The first insulating film 12a is formed on the layer difference adjustment film 14a. The second insulating film 12b is formed on the first insulating film 12a so as to cover the first wiring layer 13a.

The first wiring layer 13a and the second wiring layer 13b are, for example, metal wiring of aluminum. The first wiring layer 13a is formed on the first insulating film 12a. The second wiring layer 13b is formed on the second insulating film 12b. Stated differently, the first insulating film 12a and the second insulating film 12b correspond one-to-one to the first wiring layer 13a and the second wiring layer 13b, and are formed immediately below the corresponding one of wiring layers (the first wiring layer 13a and the second wiring layer 13b).

The layer difference adjustment film 14a is a first adjustment layer and is formed on the semiconductor substrate 11 excluding a region corresponding to the second through electrode 17b. Specifically, the layer difference adjustment film 14a has, on a second through electrode 17b-forming region, an opening 15 that is larger than the size (diameter) of the second through electrode 17b. Stated differently, the layer difference adjustment film 14a is not in contact with the second through electrode 17b. With this, a level difference between the first wiring layer 13a and the second wiring layer 13b can be reduced. It is to be noted that the level difference refers to a difference in thickness direction of the semiconductor substrate 11 between bottom surfaces of the wiring layers (the first wiring layer 13a and the second wiring layer 13b).

Furthermore, the layer difference adjustment film 14a may be made of the same material as the first insulating film 12a or the second insulating film 12b, that is, an inorganic material such as SiO2 or SiN.

The circuit protective film 16 is a second protective film which is formed above the semiconductor substrate 11 so as to cover the second wiring layer 13b that is a topmost layer. Stated differently, the circuit protective film 16 is formed on the second insulating film 12b so as to cover the second wiring layer 13b. With this, deterioration of the second wiring layer 13b due to an exposure to an external environment can be prevented. The circuit protective film 16 is generally called a passivation film and made of, for example, an inorganic material such as SiN.

The first through electrode 17a penetrates through, in the thickness direction, the semiconductor substrate 11, the layer difference adjustment film 14a and the first insulating film 12a to reach a back surface of the first wiring layer 13a. The first through electrode 17a electrically connects the first wiring layer 13a and the metal wiring 18.

The second through electrode 17b penetrates through, in the thickness direction, the semiconductor substrate 11, the first insulating film 12a and the second insulating film 12b to reach a back surface of the second wiring layer 13b. The second through electrode 17b electrically connects the second wiring layer 13b and the metal wiring 18.

It is to be noted that each of the first through electrode 17a and the second through electrode 17b is formed by plating side walls of a through-hole formed in the semiconductor substrate 11 in advance to form the first through electrode 17a and the second through electrode 17b (that is, surfaces of the through-hole connecting to the semiconductor substrate 11, the first wiring layer 13a, and the second wiring layer 13b) with, for example, Cu or a metal material mainly made of Cu, or by filling the through-hole with conductive paste. Typical depths of the through-hole are within a range of 10 μm to 300 μm. The first through electrode 17a and the second through electrode 17b may fill the through-hole or cover the inner wall of the through-hole to form a film of an approximately uniform thickness.

The external protective film 19 is a first protective film and formed on a bottom surface of the semiconductor substrate 11 so as to cover the metal wiring 18. In the same manner as with the circuit protective film 16, the external protective film 19 is made of, for example, an inorganic material such as SiN. With the external protective film 19, deterioration of the metal wiring 18 due to an exposure to an external environment is prevented. Furthermore, the external protective film 19 includes, on part of the metal wiring 18, a through-hole which is for the formation of the external electrode 20.

The external electrode 20 is formed so as to fill the through-hole formed in the external protective film 19, and is electrically connected to the metal wiring 18. The external electrode 20 is made of, for example, a lead-free solder material having a composition of Sn—Ag—Cu. With the external electrode 20, the semiconductor device 10 can be mounted on the other substrate using a flip-chip mounting method.

The bonding layer 21 is applied to bond the transparent substrate 22 and is, for example, heat-curable resin. Here, the bonding layer 21 may be formed to cover the upper surfaces of the semiconductor substrate 11 and the circuit protective film 16 as in the semiconductor device 10 shown in FIG. 1, or may also be formed to have a cavity structure that includes a hollow between the bonding layer 21 and the transparent substrate 22.

The transparent substrate 22 is bonded onto the circuit protective film 16 with the bonding layer 21. For example, the transparent substrate 22 is made of an optical glass, a support glass or the like. Note that although the transparent substrate 22 is effective particularly when the semiconductor device 10 according to this embodiment is applied to an optical device or when it functions as a reinforcing plate to reinforce the semiconductor substrate 11. However, the transparent substrate 22 is not an essential element for a structure of an end product and may be omitted depending on the use. The structure and materials for the bonding layer 21 and the transparent substrate 22 are properly selected depending on purposes such as increase in electrical characteristics of the semiconductor substrate 11 or reinforcement of the semiconductor substrate 11.

As described above, the semiconductor device 10 according to this embodiment includes: the semiconductor substrate 11 having the metal wiring 18 formed on the bottom surface of the semiconductor substrate 11; and a plurality of wiring layers formed above the semiconductor substrate 11. The wiring layers include the first wiring layer 13a and the second wiring layer 13b that is formed above the first wiring layer 13a. The semiconductor device 10 further includes: the first through electrode 17a which electrically connects the first wiring layer 13a and the metal wiring 18; the second through electrode 17b which electrically connects the second wiring layer 13b and the metal wiring 18; and the at least one layer difference adjustment film formed between the semiconductor substrate 11 and the wiring layers. The at least one layer difference adjustment film includes the layer difference adjustment film 14a formed on a region excluding a region corresponding to the second through electrode 17b.

With this, it is possible to reduce difference in thickness between the first through electrode 17a and the second through electrode 17b as compared to the case where the layer difference adjustment film 14a is not included. As a result, in the etching process for forming the first through electrode 17a and the second through electrode 17b, it is possible to reduce difference in required time between formation of through-hole that reaches the first wiring layer 13a and formation of through-hole that reaches the second wiring layer 13b.

Thus, there are less variation in the connection diameter between the first wiring layer 13a and the first through electrode 17a and a connection diameter between the second wiring layer 13b and the second through electrode 17b. Furthermore, an other layer in the vicinity of connection between each wiring layer (the first wiring layer 13a and the second wiring layer 13b) and each through electrode (the first through electrode 17a and the second through electrode 17b) is less likely to be hollowed and cave in. Specifically, the other layer refers to the first insulating film 12a and the second insulating film 12b. Furthermore, it is possible to prevent breakage and penetration of the first wiring layer 13a caused by excessive etching.

In other words, both the first through electrode 17a for the first wiring layer 13a and the second through electrode 17b for the second wiring layer 13b, which is formed above the first wiring layer 13a, can be formed stably.

Furthermore, the layer difference adjustment film 14a has, on the second through electrode 17b-forming region, the opening 15 that is larger than the size (diameter) of the second through electrode 17b, and is not in contact with the second through electrode 17b.

With this, an entire top surface of the second through electrode 17b is in contact with the second wiring layer 13b. Thus, there is less chance that the second through electrode 17b and the second wiring layer 13b become non-conductive.

Furthermore, when the semiconductor device 10 is manufactured such that the diameters of the first through electrode 17a and the second through electrode 17b on the bottom surface of the semiconductor substrate 11 are substantially the same, a connection area between the first through electrode 17a and the first wiring layer 13a and a connection area between the second through electrode 17b and the second wiring layer 13b are also substantially the same. Thus, it is easy to reduce a variation in connection area.

Furthermore, the electrical connection between the first wiring layer 13a and the external electrode 20 via the first through electrode 17a and the metal wiring 18 allows signal transferring between the inside and the outside of the semiconductor device 10 via the first wiring layer 13a, the first through electrode 17a, the metal wiring 18 and the external electrode 20. Furthermore, the electrical connection between the second wiring layer 13b and the external electrode 20 via the second through electrode 17b and the metal wiring 18 allows signal transferring between the inside and the outside of the semiconductor device 10 via the second wiring layer 13b, the second through electrode 17b, the metal wiring 18 and the external electrode 20. Note that the semiconductor substrate 11 is electrically insulated from the first through electrode 17a, the second through electrode 17b and the metal wiring 18 by an insulating film (not shown) made of, for example, SiO2.

Note that a distance from a top surface of the semiconductor substrate 11 to a top surface of the first through electrode 17a may be substantially equal to a distance from a top surface of the semiconductor substrate 11 to a top surface of the second through electrode 17b. With this, a level difference between the first wiring layer 13a and the second wiring layer 13b is substantially zero. This further stabilizes the formation of the first through electrode 17a and the second through electrode 17b.

Furthermore, when the layer difference adjustment film 14a, the first insulating film 12a, and the second insulating film 12b are made of the same material, a processing time for the formation of the first through electrode 17a and a processing time for the formation of the second through electrode 17b are the same. Specifically, in the etching process for forming the first through electrode 17a and the second through electrode 17b, time required per unit thickness of the layer difference adjustment film 14a and the second insulating film 12b becomes the same. As a result, when the layer difference adjustment film 14a and the second insulating film 12b have the same thickness, it is possible to form the first through electrode 17a and the second through electrode 17b in substantially the same processing time in a manufacturing process of the semiconductor device 10. Thus, the first through electrode 17a and the second through electrode 17b can be formed even more stably without individually controlling the processing time to form the first through electrode 17a and the second through electrode 17b.

Stated differently, the first through electrode 17a is formed for the first wiring layer 13a by penetrating two films, that is, the layer difference adjustment film 14a and the first insulating film 12a. The second through electrode 17b is formed for the second wiring layer 13b by penetrating two films, that is, the first insulating film 12a and the second insulating film 12b. Thus, even when the first through electrode 17a and the second through electrode 17b are formed for the first wiring layer 13a and the second wiring layer 13b which are the wiring layers in different layers, respectively, processing time until the first through electrode 17a reaches the first wiring layer 13a and processing time until the second through electrode 17b reaches the second wiring layer 13b can be substantially the same.

In other words, to allow the processing time for making a through-hole in the layer difference adjustment film 14a and the second insulating film 12b to be the same, it is preferable that the layer difference adjustment film 14a and the second insulating film 12b be made of materials having similar properties and have the same thickness. Note that the layer difference adjustment film 14a and the second insulating film 12b may be made of different materials, as long as the processing time for making a through-hole is the same.

In addition, although the layer difference adjustment film 14a forms a layer below the first insulating film 12a in FIG. 1 and FIG. 2, the layer is not limited to this example. It should be understood that the layer difference adjustment film 14a may be formed between the first insulating film 12a and the second insulating film 12b to achieve the same advantageous effects.

(Embodiment 2)

A semiconductor device according to Embodiment 2 is substantially the same as the semiconductor device 10 according to Embodiment 1 but is different in that the layer difference adjustment film is made of a different material than that of the second insulating film 12b. Following describes a configuration of the semiconductor device according to Embodiment 2 of the present invention with reference to FIG. 3.

Figure 3:
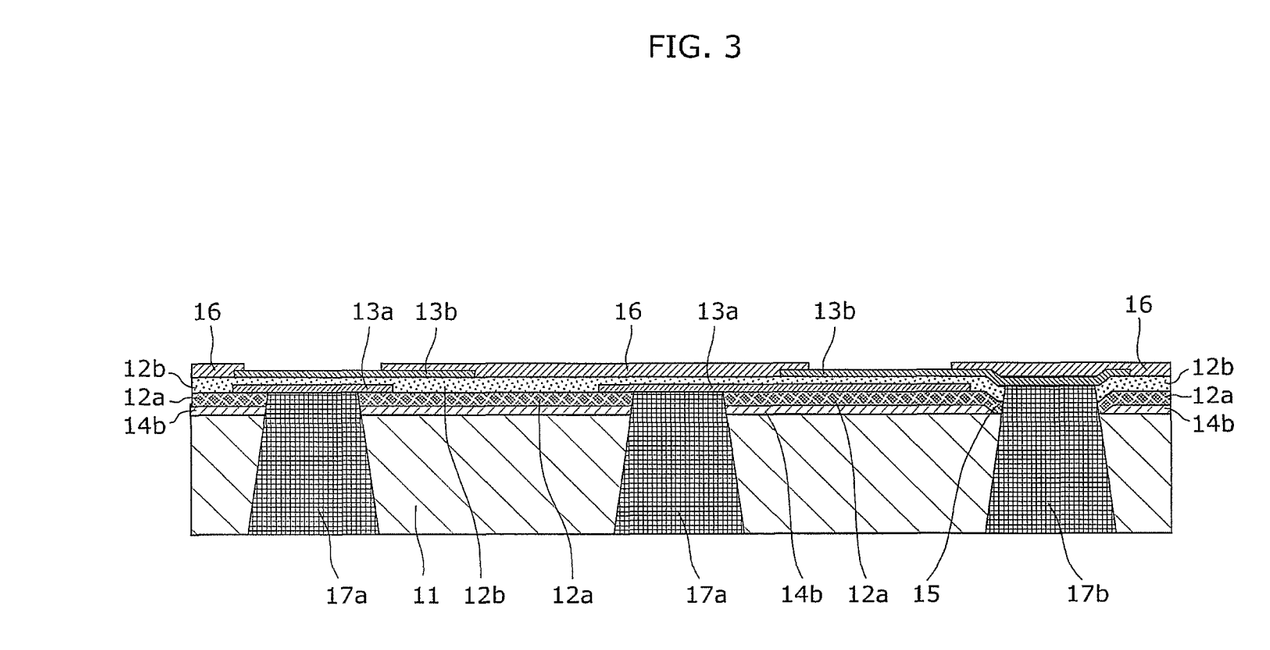
FIG. 3 is an enlarged cross-sectional view showing a configuration of main parts of a semiconductor device according to Embodiment 2 of the present invention.

FIG. 3 is a cross-sectional view showing part of a configuration of the semiconductor device according to this embodiment.

The semiconductor device according to Embodiment 2 shown in FIG. 3 includes, instead of the layer difference adjustment film 14a in Embodiment 1 shown in FIG. 2, a layer difference adjustment film 14b. The layer difference adjustment film 14b is thin compared to the thickness of the layer difference adjustment film 14a. Furthermore, the layer difference adjustment film 14b is made of a different material than that of the second insulating film 12b. The thickness of the layer difference adjustment film 14b is set and formed such that a through-hole which penetrates the layer difference adjustment film 14b and a through-hole which penetrates the second insulating film 12b are made in the same processing time. This enables to achieve the same advantageous effects as with the Embodiment 1.

(Embodiment 3)

A semiconductor device according to Embodiment 3 is different from the semiconductor device 10 according to Embodiment 1 in that the wiring layers further include a third wiring layer formed between the first wiring layer and the second wiring layer, the semiconductor device further includes a third through electrode which electrically connects the third wiring layer and the metal wiring, and the at least one adjustment layer further includes a second adjustment layer formed on a region excluding a region corresponding to the second through electrode and a region corresponding to the third through electrode.

Figure 4:
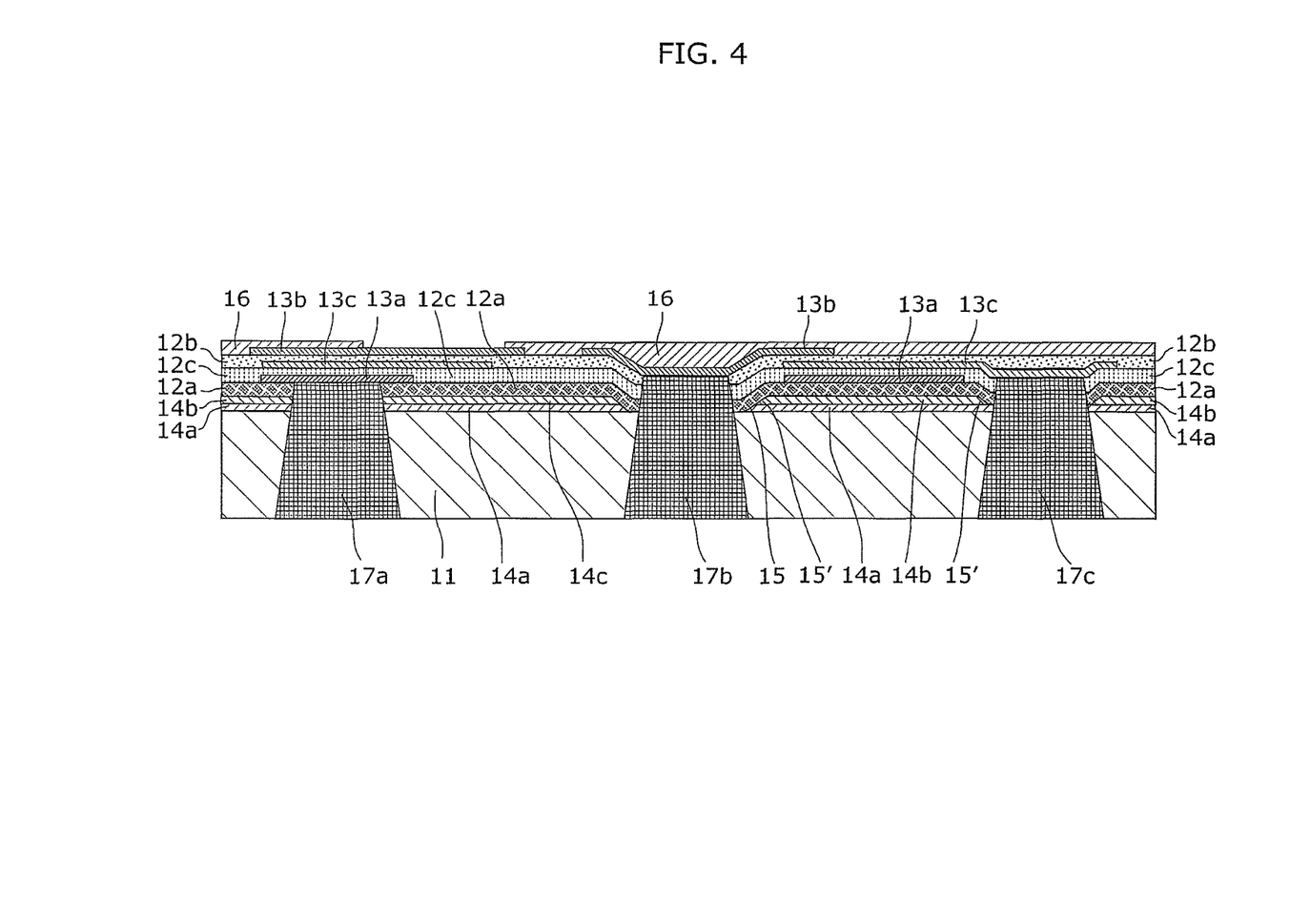
FIG. 4 is an enlarged cross-sectional view showing a configuration of main parts of a semiconductor device according to Embodiment 3 of the present invention.

Following describes a configuration of the semiconductor device according to Embodiment 3 of the present invention with reference to FIG. 4.

FIG. 4 is a cross-sectional view showing part of a configuration of the semiconductor device according to this embodiment.

Compared to the semiconductor device 10 shown in FIG. 2, the semiconductor device according to Embodiment 3 shown in FIG. 4 further includes: a third insulating film 12c, a third wiring layer 13c, a layer difference adjustment film 14c, and a third through electrode 17c.

Specifically, the third insulating film 12c is formed on the first insulating film 12a so as to cover the first wiring layer 13a. The third wiring layer 13c is formed on the third insulating film 12c. The third through electrode 17c is formed such that the third wiring layer 13c and the metal wiring 18 are electrically connected. The layer difference adjustment film 14c is the second adjustment layer and is formed between the semiconductor substrate 11 and the layer difference adjustment film 14a. In addition, the layer difference adjustment film 14c is formed on a region excluding a region corresponding to the second through electrode 17b and a region corresponding to the third through electrode 17c. With this, each of level differences among the third wiring layer 13c, the first wiring layer 13a, and the second wiring layer 13b can be reduced.

The first through electrode 17a penetrates through, in the thickness direction, the semiconductor substrate 11, the layer difference adjustment film 14a, the layer difference adjustment film 14c, and the first insulating film 12a to reach a back surface of the first wiring layer 13a. The first through electrode 17a is electrically connected to the first wiring layer 13a. The second through electrode 17b penetrates through, in the thickness direction, the semiconductor substrate 11, the layer difference adjustment film 14a, the first insulating film 12a, the third insulating film 12c, and the second insulating film 12b to reach a back surface of the second wiring layer 13b. The second through electrode 17b is electrically connected to the second wiring layer 13b. Furthermore, the third through electrode 17c penetrates through, in the thickness direction, the semiconductor substrate 11, the layer difference adjustment film 14a, the first insulating film 12a, the second insulating film 12b, and the third insulating film 12c to reach a back surface of the third wiring layer 13c. The third through electrode 17c is electrically connected to the third wiring layer 13c.

Here, the layer difference adjustment film 14c has, on the third through electrode 17c-forming region, the opening 15' that is larger than the size (diameter) of the second through electrode 17b, and is not in contact with the third through electrode 17c. Furthermore, the layer difference adjustment film 14a and the layer difference adjustment film 14c have, respectively, on the second through electrode 17b-forming region, the openings 15 and 15' that are larger than the size (diameter) of the second through electrode 17b, and are not in contact with the second through electrode 17b.

Stated differently, the first through electrode 17a is formed for the first wiring layer 13a by penetrating three films, that is, the layer difference adjustment film 14a, the layer difference adjustment film 14b, and the first insulating film 12a. The third through electrode 17c is formed for the third wiring layer 13c by penetrating three films, that is, the layer difference adjustment film 14a, the first insulating film 12a, and the third insulating film 12c. The second through electrode 17b is formed for the second wiring layer 13b by penetrating three films, that is, the first insulating film 12a, the third insulating film 12c, and the second insulating film 12b. Thus, even when each of the through electrodes (the first through electrode 17a, the second through electrode 17b, the third through electrode 17c) is formed for a corresponding one of wiring layers (the first wiring layer 13a, the second wiring layer 13b, the third wiring layer 13c) formed in different layers, processing time until the first through electrode 17a reaches the first wiring layer 13a, processing time until the second through electrode 17b reaches the second wiring layer 13b, and processing time until the third through electrode 17c reaches the third wiring layer 13c can be substantially the same. Specifically, in the same manner as in above-described Embodiment 1 and Embodiment 2, the materials and the thicknesses of the layer difference adjustment film 14a and the layer difference adjustment film 14b may be set such that each of through-holes is made in the same processing time.

It is to be noted that the layer difference adjustment film 14a and the layer difference adjustment film 14b do not necessarily have to be made of the same material and have the same thickness, but may be optimized to adjust the processing time to make a through-hole.

As described above, even in the case where three layers of wiring layers (the first wiring layer 13a, the second wiring layer 13b, and the third wiring layer 13c) are included, the semiconductor device according to this embodiment allows for stable formation of each of the through electrodes (the first through electrode 17a, the second through electrode 17b, and the third through electrode 17c) for a corresponding one of the wiring layers.

Although embodiments of the present invention have been described thus far, the present invention is not limited to such embodiments. Various modifications to the above-described embodiments or forms constructed by combining constituent elements of different embodiments that may be conceived by a person of ordinary skill in the art which do not depart from the essence of the present invention are intended to be within the scope of the present invention.

For example, the semiconductor device according to Embodiment 1 to Embodiment 3 may be applied to electronic apparatuses which include the semiconductor devices. The examples include optical devices (a variety of semiconductor devices such as solid-state imaging elements, photodiodes, and laser modules, and various modules). In this case, the metal wiring 18, the external protective film 19, and the external electrode 20 are properly selected and formed depending on a configuration and specification referred to when mounting the semiconductor device onto a wiring substrate of an electronic apparatus.

Furthermore, the semiconductor device according to Embodiment 1 and Embodiment 2 includes two layers of the wiring layer, two layers of the insulating film, and one layer of the layer difference adjustment film, while the semiconductor device according to Embodiment 3 includes three layers of the wiring layer, three layers of the insulating film, and two layers of the layer difference adjustment film. However, the number of the layers of the wiring layer, the insulating film, and the layer difference adjustment film is not limited to the above. Specifically, the semiconductor device according to the present invention may include four or more layers of the wiring layers, four or more layers of the insulating film, and three or more layers of the layer difference adjustment film.

Here, it is preferable that the insulating layers be provided corresponding to the wiring layers one-to-one and each of the insulating layers be formed immediately below the corresponding one of the wiring layers, and the adjustment layers be formed below the insulating layers. Furthermore, it is preferable that the number of layers of the insulating layers be the same as the number of layers of the wiring layers. Furthermore, it is preferable that the number of the adjustment layers be one less than the number of layers of the wiring layers.

INDUSTRIAL APPLICABILITY

The semiconductor device according to the present invention is applicable particularly to optical devices (a variety of semiconductor devices such as solid-state imaging elements, photodiodes, and laser modules, and various modules), and to semiconductor devices including other LSIs, memories, vertical devices (for example, diodes, transistors), and interposers.

What is claimed is:

1. A semiconductor device comprising:
a semiconductor substrate having metal wiring formed on a bottom surface of said semiconductor substrate; and
a plurality of wiring layers formed above said semiconductor substrate,
wherein said wiring layers include a first wiring layer and a second wiring layer that is formed above said first wiring layer,
said semiconductor device further comprising:
a first through electrode which electrically connects said first wiring layer and said metal wiring;
a second through electrode which electrically connects said second wiring layer and said metal wiring; and
at least one adjustment layer formed between said semiconductor substrate and said wiring layers, and
said at least one adjustment layer includes a first adjustment layer formed on a region excluding a region corresponding to said second through electrode.

2. The semiconductor device according to claim 1, further comprising
a plurality of insulating layers,
wherein said insulating layers correspond one-to-one to said wiring layers, each of said insulating layers being formed immediately below a corresponding one of said wiring layers, and
said at least one adjustment layer is formed below said insulating layers.

3. The semiconductor device according to claim 2,
wherein said at least one adjustment layer is made of a same material as a material for said insulating layers.

4. The semiconductor device according to claim 2,
wherein the number of layers of said insulating layers is the same as the number of layers of said wiring layers.

5. The semiconductor device according to claim 1,
wherein the number of layers of said at least one adjustment layer is one less than the number of layers of said wiring layers.

6. The semiconductor device according to claim 1,
wherein said at least one adjustment layer is not in contact with said second through electrode.

7. The semiconductor device according to claim 1,
wherein said first through electrode and said second through electrode penetrate through a same number of layers.

8. The semiconductor device according to claim 1,
wherein a distance from a top surface of said semiconductor substrate to a top surface of said first through electrode is substantially equal to a distance from a top surface of said semiconductor substrate to a top surface of said second through electrode.

9. The semiconductor device according to claim 1,
wherein said wiring layers further include a third wiring layer formed between said first wiring layer and said second wiring layer,
said semiconductor device further comprising a third through electrode which electrically connects said third wiring layer and said metal wiring, and
said at least one adjustment layer further includes a second adjustment layer formed on a region excluding a region corresponding to said second through electrode and a region corresponding to said third through electrode.

10. The semiconductor device according to claim 1,
wherein said at least one adjustment layer is made of silicon oxide or silicon nitride.

11. The semiconductor device according to claim 1, further comprising
a first protective film that is formed on the bottom surface of said semiconductor substrate so as to cover said metal wiring,
wherein said first protective film includes a through-hole formed to penetrate through said first protective film, from a top surface to a bottom surface, on a region overlapping said metal wiring.

12. The semiconductor device according to claim 11, further comprising
an external electrode that is formed inside said through-hole and on said first protective film so as to plug said through-hole,
wherein said external electrode is electrically connected to said first wiring layer through said metal wiring and said first through electrode or to said second wiring layer through said metal wiring and said second through electrode.

13. The semiconductor device according to claim 1, further comprising a second protective film that is formed above said semiconductor substrate so as to cover a topmost wiring layer among said wiring layers.

14. The semiconductor device according to claim 13, further comprising a transparent substrate that is formed on said second protective film with a bonding layer interposed between said second protective film and said transparent substrate.

15. An electronic apparatus comprising the semiconductor device according to claim 1.

* * * * *